(12) United States Patent
Watanabe

(10) Patent No.: US 6,740,822 B2
(45) Date of Patent: May 25, 2004

(54) PRINTED CIRCUIT BOARD HAVING FOOTPRINTS, CIRCUIT MODULE HAVING A PRINTED CIRCUIT BOARD, AND METHOD OF MANUFACTURING A PRINTED CIRCUIT BOARD

(75) Inventor: Nagahisa Watanabe, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,758

(22) Filed: Mar. 21, 2002

(65) Prior Publication Data

US 2002/0134577 A1 Sep. 26, 2002

(30) Foreign Application Priority Data

Mar. 23, 2001 (JP) ........................................ 2001-085816

(51) Int. Cl.[7] .............................................. H05K 12/04
(52) U.S. Cl. ...................................... 174/260; 361/772
(58) Field of Search ................ 174/260; 361/772–779; 29/840, 843

(56) References Cited

U.S. PATENT DOCUMENTS

| 3,770,874 A | * | 11/1973 | Krieger et al. ............... 174/257 |
| 5,426,266 A | * | 6/1995 | Brown et al. ................. 174/267 |
| 6,115,262 A | * | 9/2000 | Brunner et al. .............. 361/774 |
| 6,300,679 B1 | * | 10/2001 | Mukerji et al. ............... 257/738 |
| 6,388,203 B1 | * | 5/2002 | Rinne et al. ................. 174/261 |
| 6,521,845 B1 | * | 2/2003 | Barrow ........................ 174/260 |
| 6,613,662 B2 | * | 9/2003 | Wark et al. .................. 438/613 |

FOREIGN PATENT DOCUMENTS

| JP | 02-038772 | 3/1990 |
| JP | 08-204317 | 8/1996 |
| JP | 10-022617 | 1/1998 |
| JP | 10-303330 | 11/1998 |
| JP | 2000-261131 | 9/2000 |

* cited by examiner

Primary Examiner—Kamand Cuneo
Assistant Examiner—Jeremy Norris
(74) Attorney, Agent, or Firm—Finnegan, Henderson, Farabow, Garrett & Dunner, L.L.P.

(57) ABSTRACT

A printed circuit board includes a substrate having a mounting surface on which a surface mount device having at least one terminal is to be mounted. On the mounting surface, at least one footprint is arranged and positioned to align with the terminal. The footprint comprises a plurality of patterned parts and a plurality of solder layers formed on the patterned parts, respectively. Each patterned part is so shaped to limit a region in which molten solder flows when the solder layer is melted.

5 Claims, 5 Drawing Sheets

PRINTED CIRCUIT BOARD HAVING FOOTPRINTS, CIRCUIT MODULE HAVING A PRINTED CIRCUIT BOARD, AND METHOD OF MANUFACTURING A PRINTED CIRCUIT BOARD

CROSS-REFERENCE TO RELATED APPLICATIONS

This application is based upon and claims the benefit of priority from the prior Japanese Patent Application No. 2001-085816, filed Mar. 23, 2001, the entire contents of which are incorporated herein by reference.

BACKGROUND OF THE INVENTION

1. Field of the Invention

The present invention relates to a printed circuit board that has footprints to which a surface mount device may be soldered, to a circuit module that comprises a printed circuit board to which surface mount devices are soldered, and to a method of manufacturing a printed circuit board that has footprints.

2. Description of the Related Art

A surface mount device, such as a bare chip, a SOP (Small Outline Package) or a QFP (Quad Flat Package), is secured to the mounting region of a printed circuit board by reflow soldering. The reflow soldering is performed in the following sequence of steps.

First, a printed circuit board is prepared, which has a mounting region and a plurality of footprints formed in the mounting region. Next, solder paste is applied onto the footprints, forming solder layers that cover the footprints. Then, the surface mount device is mounted at the prescribed position in the mounting region, by using a parts mounter. The terminals of the surface mount device therefore contact the solder layers. Thereafter, the printed circuit board is placed in a reflow oven and heated therein. As the board is heated, the solder layers melt and spread over the footprints. Finally, the printed circuit board is cooled, hardening the solder layers. As a result, the terminals are connected to the footprints, both electrically and mechanically. The surface mount device is thereby secured to the printed circuit board.

The footprints provided on the conventional printed circuit board are rectangular strips, each having a size proportional to the terminal it holds. Being rectangular, each footprint has an area greater than is necessary. Inevitably, the amount of solder applied to each footprint must be larger than necessary. Consequently, the solder flows in a large amount on each footprint, from the center part of the footprint toward the corners thereof, when the printed circuit board is heated in the reflow oven.

As the molten solder so flows, the surface mount device may move from the desired position or may rotate, even if the device has been placed at the very desired position in the mounting region of the printed circuit board. To state it more precisely, the molten solder is likely to flow toward the corners of the footprint, because the right-angled corners lie outside the terminal it holds. As the molten solder so flows, the surface mount device may rotate with respect to the footprints. If the printed circuit board is cooled in this condition, the surface mount device is secured to the board, rotated from the desired position, possibly interfering with the other circuit devices provided on the board or causing short-circuiting on the board.

After the soldering, the printed circuit board is inspected. If any surface mount device is found to have rotated in excess, it must be removed from the mounting region of the board and soldered again at the desired position in the mounting region. This repairing requires much time and labor, reducing the efficiency of mounting the device on the printed circuit board.

Jpn. Pat. Appln. KOKAI Publication No. 2000-261131 discloses a modified method of soldering electronic devices of surface mount type to a printed circuit board. The method uses footprints, each comprising two parts that are spaced apart from each other. Therefore, after the terminals of an electronic device are soldered to the footprints provided on the board, each terminal straddles the two parts of one footprint.

The soldering method disclosed in Publication No. 2000-261131 is devised mitigate the stress generated at the junction between footprints and terminals if the terminals are soldered to the footprints, by using lead-free solder, i.e., solder that has high rigidity. Publication No. 2000-261131 teaches no techniques of preventing the surface mount device from moving from the desired position.

Both parts of every footprint disclosed in Publication No. 2000-261131 are rectangular, each having four right-angled-corners. The footprints are not different at all, in shape, from those provided on the conventional printed circuit. The molten solder tends to flow toward the corners of either part of each footprint as the printed circuit board is heated during the reflow soldering. Hence, it is impossible to prevent the surface mount device from moving from the desired position in the process of soldering the device to the printed circuit board.

BRIEF SUMMARY OF THE INVENTION

An object of the present invention is to provide a printed circuit board on which a surface mount device can be prevented from moving while being soldered to the board and can therefore be arranged at a desired position and to provide a method of manufacturing a printed circuit board of this type.

Another object of the invention is to provide a circuit module that has a printed circuit board of the type described above.

To attain the objected mentioned first, a printed circuit board according to a first aspect of the invention comprises: a substrate having a mounting surface on which the surface mount device is to be mounted; and at least one footprint arranged on the mounting surface and positioned to align with the terminal of the surface mount device. The footprint comprises a plurality of patterned parts and a plurality of solder layers formed on the patterned parts, respectively. Each of the patterned parts is so shaped to limit a region in which molten solder flows when the solder layer is melted.

To achieve the first-mentioned object, a printed circuit board according to a second aspect of the invention comprises: a substrate having a mounting surface on which a surface mount device having a plurality of leads arranged at intervals is to be mounted; and a plurality of footprints arranged, side by side, on the mounting surface of the substrate and positioned to align with the leads, respectively. Each of the footprints comprises a plurality of patterned parts and a plurality of solder layers formed on the patterned parts, respectively. The patterned parts are arranged in a column, spaced apart in a lengthwise direction of the lead and so shaped to limit a region in which molten solder flows when the solder layer is melted.

To attain the second-mentioned object, a circuit module according to a third aspect of the invention comprises: a surface mount device having at least one terminal; a printed circuit board having a mounting surface on which the surface mount device is soldered; and at least one footprint arranged on the mounting surface and positioned to align with the terminal of the surface mount device. The footprint comprises a plurality of patterned parts and a plurality of solder layers formed on the patterned parts, respectively. Each of the patterned parts is so shaped to limit a region in which molten solder flows when the solder layer is melted.

A method of manufacturing a printed circuit board, according to a fourth aspect of the invention, comprises: forming at least one footprint on a mounting surface of a substrate and in alignment with a terminal of a surface mount device, the footprint comprising a plurality of patterned parts which have a shape selected from the group consisting of a circular shape, a rectangular shape having rounded corners, and a polygonal shape having at least five corners; coating the patterned parts with solder paste through a screen mask laid on the mounting surface of the substrate, thereby covering the patterned parts with solder layers; and applying solder resist to the mounting surface of the substrate, except regions in which the patterned parts are provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The first embodiment of this invention will be described, with reference to FIGS. 1 to 7.

Figure 1:
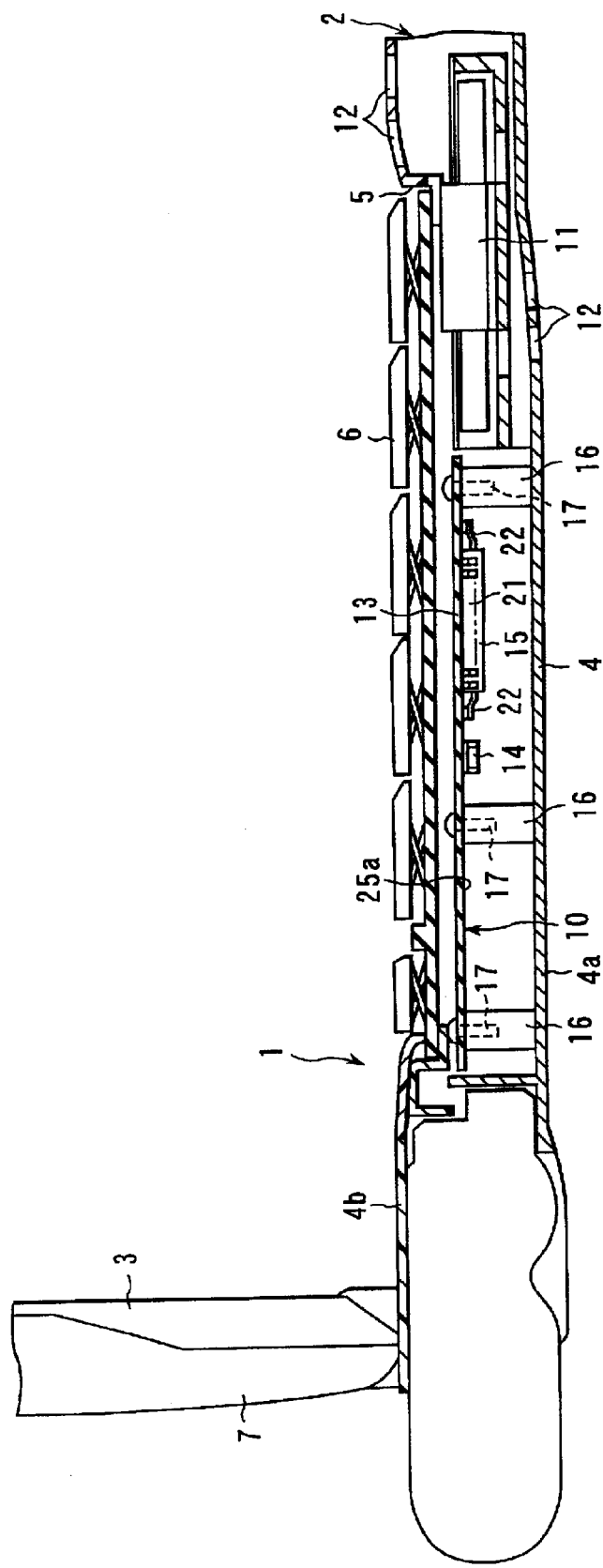
FIG. 1 is a sectional view of a portable computer according to the first embodiment of this invention.

FIG. 1 shows a notebook-type portable computer 1, or an electronic apparatus. The portable computer 1 comprises a main body 2 and a display unit 3 supported on the main body 2.

The main body 2 has a housing 4 that is shaped like a flat box. The housing 4 has a bottom wall 4a and a top wall 4b. The top wall 4b has a keyboard receptacle 5 in its upper surface. The receptacle 5 holds a keyboard 6. The display unit 3 comprises a display housing 7 that incorporates a liquid crystal display panel (not shown). The display housing 7 is coupled to the rear edge of the housing 4 and can be rotated.

The housing 4 contains a circuit module 10 and a cooling fan 11. The cooling fan 11 is provided to cool the circuit module 10. More specifically, the fan 11 receives air taken into the housing 4 via air inlet ports 12 of the housing 4 and applies the air, or cooling air, to the circuit module 10.

The circuit module 10 comprises a printed circuit board 13, a chip device 14, a QFP (Quad Flat Package) 15, and some other circuit components (not shown). The printed circuit board 13 is secured to the bosses 16 with screws. The bosses 16 protrude upwards from the bottom wall 4a of the housing 4.

Figure 2:
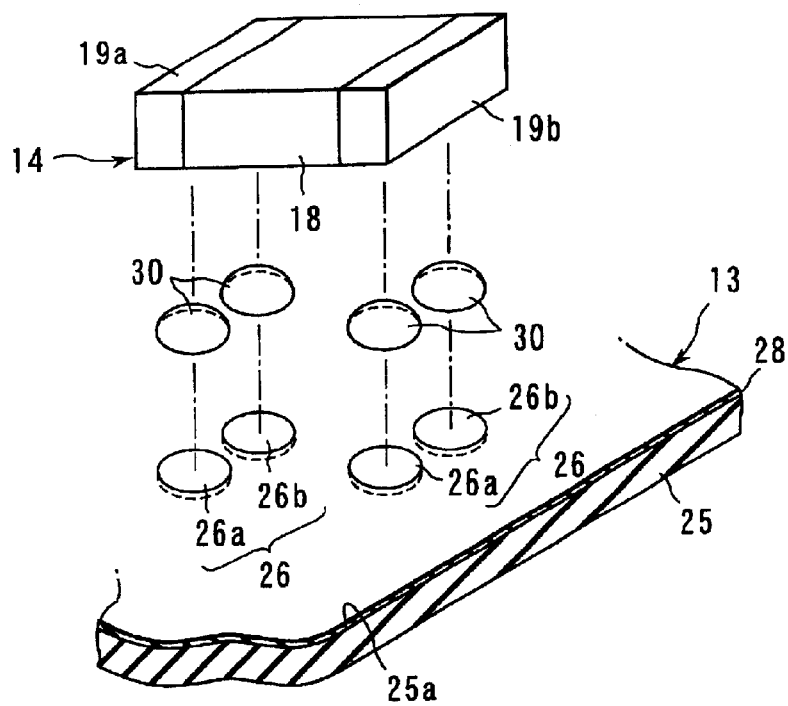
FIG. 2 is an exploded view of a circuit module, illustrating the positional relation between a chip device and a printed circuit board having footprints, each covered with a solder layer.

The chip device 14 and the QFP 15 are surface mount devices. They are soldered to the printed circuit board 13. The chip device 14 is, for example, 1.0 mm long and 0.5 mm wide. As FIG. 2 shows, the device 14 comprises a body 18 and a pair of electrode terminals 19a and 19b. The first terminal 19a is provided at one end of the body 18, and the second terminal 19b at the other end of the body 18.

Figure 5:
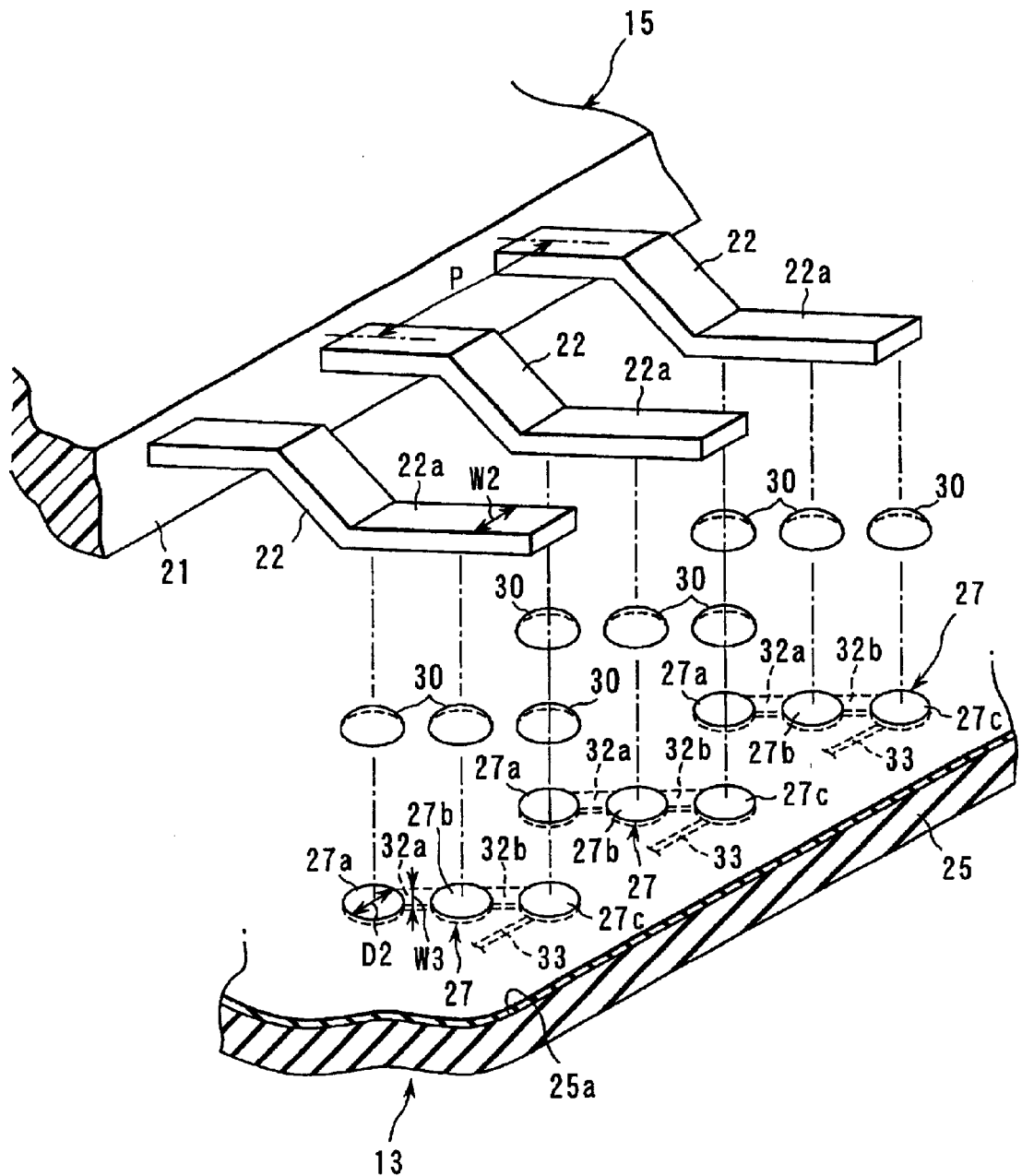
FIG. 5 is an exploded view of the circuit module, showing the positional relation between a QFP (Quad Flat Package) and the printed circuit board having footprints, each covered with a solder layer.

The QFP 15 comprises a package body 21 and a plurality of leads 22. The package body 21 is rectangular, having four sides. As FIG. 5 shows, the leads 22, or terminals, extend from the four sides of the package body 21 and are bent in the form of gull wings. Each lead 22 has a distal end portion 22a that extends straight. The leads 22 provided at any side of the body 21 extend parallel, spaced apart from one another. The more functions the QFP 15 performs, the more leads 22 it has. The more leads 22 the QFP 15 has, the shorter the pitch P at which the leads 22 are spaced.

Figure 3:
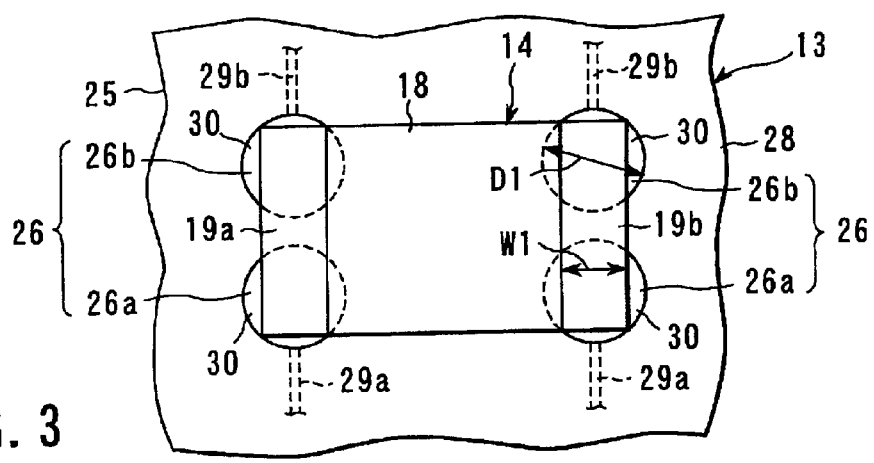
FIG. 3 is a plan view of the circuit module, showing the chip device soldered to the mounting surface of the printed circuit board.
Figure 4:
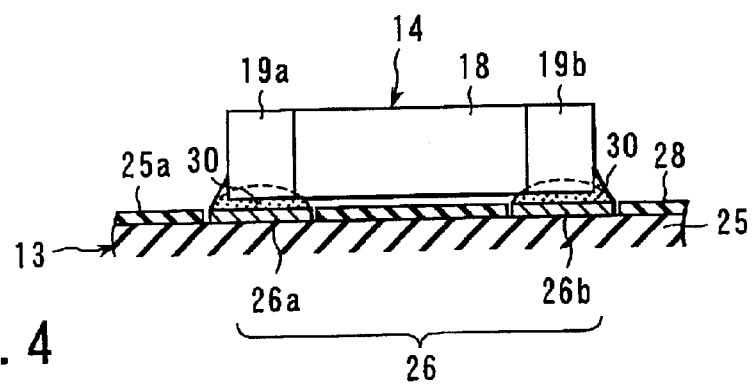
FIG. 4 is a sectional view of the circuit module, depicting the chip device soldered to the printed circuit board.
Figure 6:
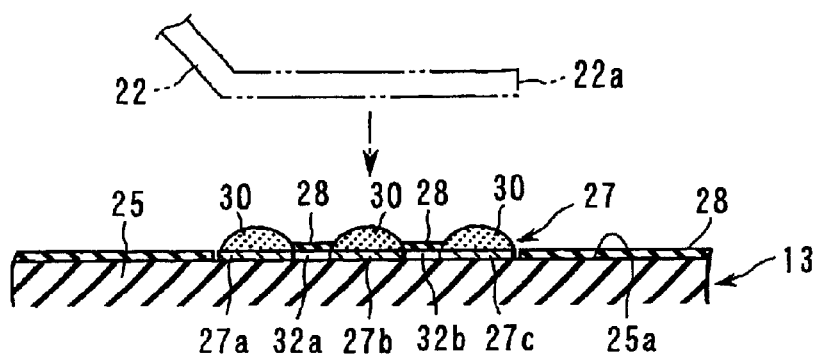
FIG. 6 is a sectional view of the circuit module, illustrating the positional relation between the leads of the QFP, on the one hand, and the footprints provided on the board, on the other hand.
Figure 7:
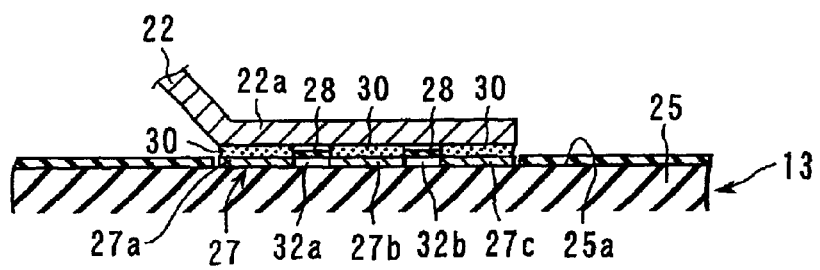
FIG. 7 is a sectional view of the circuit module with the leads soldered to the mounting surface of the printed circuit board.

The printed circuit board 13 comprises a multi-layered substrate 25. The substrate 25 has a mounting surface 25a to which the chip device 14 and the QFP 15 are soldered. The mounting surface 25a opposes the bottom wall 4a of the housing 4. As FIGS. 2 to 4 show, two footprints 26 are provided on the mounting surface 25a. The footprints 26 are aligned with the electrode terminals 19a and 19b of the device 14, respectively. They electrically connect the chip device 14 to the substrate 25. As FIGS. 5 and 6 show, other footprints 27 are provide on the mounting surface 25a. The footprints 27 are aligned with the leads 22 of the QFP 15. They electrically connect the QFP 15 to the substrate 25. The footprints 26 and 27 are made of copper foil; they are known as "pads." A solder resist 28 covers the entire mounting surface 25a, except footprints 26 and 27.

As is best shown in FIGS. 2 and 3, each footprint 26 consists of two patterned parts 26a and 26b. The patterned parts 26a and 26b of the first footprint 26 are aligned with the first electrode terminal 19a of the chip device 14. The patterned parts 26a and 26b of the second footprint 26 are aligned with the second electrode terminal 19b of the chip device 14. The patterned parts 26a and 26b of either footprint 26 are spaced apart by a distance equal to or shorter than the electrode terminal (19a or 19b). The solder resist 28 lies between the parts 26a and 26b. The parts 26a and 26b are therefore electrically isolated from each other. The parts 26a and 26b have no corners. More precisely, they are either circular or elliptical. The patterned parts 26a and 26b have a diameter D1 that is a little larger than the width W1 of the electrode terminals 19a and 19b. The patterned parts 26a and 26b of either footprint 26 are electrically connected to patterned conductors 29a and 29b provided on the mounting surface 25a of the substrate 25.

The patterned parts 26a and 26b of either footprint 26 are covered with solder layers 30. When the solder layers 30 melt, the solder spreads along the electrode terminal 19a or 19b, filling the gap between the patterned part 26a and the electrode terminal 19a and the gap between the patterned part 26b and the electrode terminal 19b. The solder layers 30 have been formed by print coating the pattered parts 26a and 26b with solder paste.

The print coating of solder paste is performed by using a screen mask of the known type. The screen mask has openings that have the same size as the patterned parts 26a and 26b. The mask is laid on the mounting surface 25a of the substrate 25 and positioned with respect thereto, as is desired. The solder paste is applied to the patterned parts 26a and 26b through the openings of the screen mask, by the use of a squeegee. Solder layers 30 are thereby formed on the patterned parts 26a and 26b. The amount of solder paste used to form the solder layer 30 is the product of the thickness of the screen mask and the area of one opening of the mask. After the solder layers 30 are formed on the patterned parts 26a and 26b, the screen mask is removed from the mounting surface 25a of the substrate 25.

The openings of the screen mask are circular; they have the same shape as the patterned parts 26a and 26b. Being circular, the openings can be made more easily than otherwise in the mask more. Not polygonal, the openings have no corners. This brings forth two advantages. First, the solder past can be readily applied to the patterned parts 26a and 26b readily than otherwise. Second, the screen mask can be smoothly removed from the substrate 25. As indicated by the broken lines in FIG. 4, the solder layers 30 formed by applying the solder paste to the patterned parts 26a and 26b are almost semispherical.

As FIGS. 5 and 6 show, the footprints 27 of the QFP 15 each comprise three patterned parts 27a, 27b and 27c and two bridges 32a and 32b.

The patterned parts 27a, 27b and 27c of each footprint 27 are arranged in a row that is aligned with the distal end portion 22a of one lead 22. They are spaced apart from one another, for a distance shorter than the distal end portion 22a of the lead 22. The patterned parts 27a, 27b and 27c have no corners. Preferably, they are either circular or elliptical. The patterned parts 27a, 27b and 27c have a diameter D2 that is nearly equal to the width W2 of the distal end portion 22a of the lead 22. The patterned part 27c is electrically connected to a conductor 33 provided on the mounting surface 25a.

The bridges 32a and 32 are made of copper foil. The bridge 32a electrically connects the patterned parts 27a and 27b, and the bridge 32b connects the patterned parts 27b and 27c. The bridges 32a and 32b extend in a line that connects the centers of the patterned parts 27a, 27b and 27c.

The bridges 32a and 32b have a width W3 that is smaller than the diameter D2 of the patterned parts 27a, 27b and 27c. It is desired that the width W3 be half the diameter D2 or less. As shown in FIG. 6, the bridges 32a and 32b are covered with solder resists 28. Hence, only the patterned parts 27a, 27b and 27c are exposed at the mounting surface 25a of the substrate 25.

Solder layers 30 cover the upper surfaces of the patterned parts 27a, 27b and 27c. When heated, the solder layers 30 melt and spread over the patterned parts 27a, 27b and 27c and the distal end portion 22a of the lead 22. Finally, the solder fills the gaps between the distal end portion 22a of the lead 22, on the one hand, and the patterned parts 27a, 27b and 27c, on the other hand. The solder layers 30 have been formed by print coating the pattered parts 27a, 27b and 27c with solder paste. The print coating of solder paste is performed in the same way as in the case of the footprints 26.

The method of assembling the circuit module 10 will be described.

First, the printed circuit board 13 is prepared, which has footprints 26 and footprints 27 provided on the mounting surface 25a of the substrate 25. Next, solder paste is applied to the patterned parts 26a and 26b of the footprints 26 and to the patterned parts 27a, 27b and 27c of the footprints 27, by means of print coating. Solder layers 30, which are almost semispherical, are thereby formed on the patterned parts 26a and 26b of the footprints 26, and on the patterned parts 27a, 27b and 27c of the footprints 27. Then, the chip device 14 and the QFP 15 are mounted at prescribed positions on the mounting surface 25a, by using a parts mounter. The electrode terminals 19a and 19b of the chip device 14 are thereby placed on the footprints 26, each covered with the solder layer 30. Similarly, the leads 22 of the QFP 15 have their distal end portions 22a placed on the footprints 27, each covered with the solder layer 30.

Thereafter, the printed circuit board 13 is placed in a reflow oven and heated therein. As the board 13 is heated, the solder layers 30 on the patterned parts 26a and 26b of each footprint 26 melt. The molten solder spreads over the circular patterned part 26a and 26b and the electrode terminal 19a or 19b, filling the gap between the part 26a and the terminal and the gap between the part 26b and the terminal. Similarly, the solder layers 30 on the patterned parts 27a, 27b and 27c of each footprint 27 melt. The molten solder spreads over the circular parts 27a, 27b and 27c and the distal end portion 22a of the lead 22, filling the gaps between the parts 27a, 27b and 27c, on the one hand, and the distal end portion 22a, on the other.

Finally, the printed circuit board 13 is cooled, hardening the molten solder. As a result, the electrode terminals 19a and 19b of the chip device 14 are thereby electrically connected to the footprints 26. At the same time, the leads 22 of the QFP 15 are connected to the footprints 27, both electrically and mechanically. The chip device 14 and the QFP 15 are thereby mounted on the mounting surface 25a of the substrate 25. Thus, the circuit module 10 is assembled.

In the first embodiment described above, the two footprints 26 to which the electrode terminals 19a and 19b are soldered comprise two patterned parts 26a and 26b each. The total area of the parts 26a and 26b is smaller than the area of a single patterned part provided on the conventional printed circuit board. The amount of solder applied to each footprint 26 is therefore comparatively small.

Each footprint 27 to which one lead 22 of the QFP 15 is soldered comprises three patterned parts 27a, 27b and 27c. The total area of the parts 27a, 27b and 27c is smaller than the area of a single patterned part provided on the conventional printed circuit board. The amount of solder applied to each footprint 27 is therefore comparatively small.

The molten solder flows, but only on the patterned parts 26a and 26b of each footprint 26 and the patterned parts 27a, 27b and 27c of each footprint 27. Since the patterned parts 26a, 26b, 27a, 27b and 27c are small, the area over which the molten solder flows is small and limited. For the same reason, the molten solder flows in a small amount.

As indicated above, the patterned parts 26a, 26b, 27a, 27b and 27c are circular. Therefore, the footprints 26 have no corners that extend outside the electrode terminals 19a and 19b. Nor do the footprints 27 have corners that extend outside the distal end portions 22a of the leads 22. The molten solder never flows out into any regions outside the electrode terminals 19a and 19b or the distal end portions 22a of the leads 22. This minimizes the area in which the molten solder may flow.

Hence, the chip device 14 is prevented from rotating from its desired positions with respect to the footprints 26, and the QFP 15 is prevented from rotating from its desired position with respect to the footprints 27. In other words, the chip device 14 and the QFP 15 can be soldered at the desired positions on the mounting surface 25a with high precision.

As described above, the bridges 32a and 32b of each footprint 27 extends in a line that connects the centers of the patterned parts 27a, 27b and 27c and have a width W3 smaller than the diameter D2 of the patterned parts 27a, 27b and 27c. Thus, the corner defined by the periphery of any patterned part and the adjacent bridge does not lie outside the patterned part. It follows that, as molten solder flows toward the corner, it pulls the distal end portion 22a of the lead 22 toward the line that connects the centers of the patterned parts 27a, 27b and 27c. The lead 22 is therefore moved to align with that line. This also prevents the QFP 15 from rotating from its desired position with respect to the footprints 27.

Note that the bridges 32a and 32b are covered with solder resists 28. The solder resists 28 prevent the molten solder (i.e., the solder layers 30 on the patterned parts 27a, 27b and 27c) from spreading over the bridges 32a and 32b. That is, the solder resists 28 confine the molten solder on the patterned parts 27a, 27b and 27c. The region in which the solder may flow is reduced to a minimum.

The bridges 32a and 32b electrically connect the adjacent patterned parts 27a, 27b and 27c. It therefore suffices to connect only the part 27c to the conductor 33, though each footprint 27 comprises three patterned parts 27a, 27b and 27c. Namely, all three parts 27a, 27b and 27 need not be electrically connected to the substrate 25. In other words, no conductors are required to connect the patterned parts 27a and 27b to the substrate 25. This helps to reduce the manufacturing cost of the printed circuit board 13.

The chip device 14 or the QFP 15, or both may be found to be defective in the inspection performed after they have been soldered to the substrate 25. In this case, the device 14 or the QFP 15, or both are locally heated with high-temperature gas, melting the solder, and are thereby removed from the printed circuit board 13.

In this repairing process, the solder can be melted within a short time, and the chip device 14 and the QFP 15 can be easily removed from the printed circuit board 13. This is because each footprint 26 and each footprint 27 are composed of, respectively, two small parts 26a and 26 and three small parts 27a, 27b and 27c, the chip device 14 and the QFP 15 therefore contact the substrate 25 at small areas. Thus, only a small amount of solder is required to secure the device 14 and the QFP 15 to the substrate 25.

Since the amount of solder used to fasten the chip device 14 and the QFP 15 to the substrate 25 is small, the chip 14 and the QFP 15 can be located at low levels with respect to the mounting surface 25a. This renders the circuit module 10 thin and compact. The circuit module 10 can therefore be accommodated in the limited space provided in the housing 4.

In the present invention, the shape and number of footprints 26 and 27 are not limited to those adopted in the first embodiment.

Figure 8:
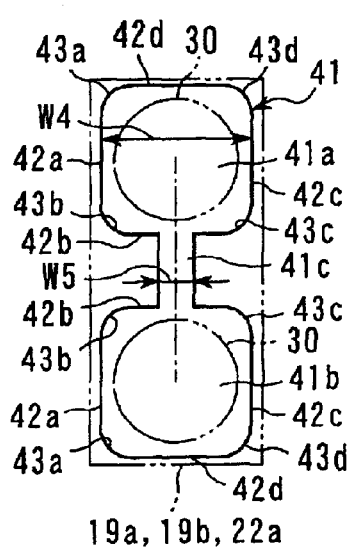
FIG. 8 is a plan view of a footprint according to the second embodiment of the invention.

FIG. 8 shows a footprint 41 according to the second embodiment of the invention. This footprint 41 comprises a pair of patterned parts 41a and 41b and one bridge 41c. The patterned parts 41a and 41b are not circular, each being almost square. Each patterned part has four sides 42a, 42b, 42c and 42d and four rounded corners 43a, 43b, 43c and 43d. The rounded corners 43a and 43c diagonally oppose each other; the rounded corners 43b and 43d diagonally oppose each other. That is, either patterned part is square but has no right-angled corners. The patterned parts 41a and 41b have a width W4 that is a little smaller than the width W1 of the electrode terminals 19a and 19b and the width W2 of the distal end portion 22a of the lead 22.

The bridge 41c straddles the patterned parts 41a and 41b, connecting the parts 41a and 41b together. The bridge 41c extends in a line connecting the centers of the patterned parts 41a and 41b. The width W5 of the bridge 41c is smaller than the width W4 of the patterned parts 41a and 41b. Preferably, the width W5 is half the width W4 or less. A solder resist covers the bridge 41c.

The corners of the patterned parts 41a and 41b do not lie outside the electrode terminal 19a or 19b, or the distal end portion 22a of the lead 22. This prevents molten solder from flowing outwards from the terminals 19a or 19b or from the distal end portion 22a of the lead 22. The region in which the solder may flow is reduced to a minimum.

Figure 9:
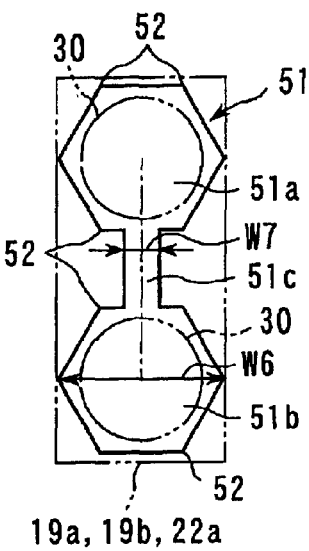
FIG. 9 is a plan view of a footprint according to the third embodiment of the invention.

FIG. 9 depicts a footprint 51 according to the third embodiment of the invention. This footprint 51 comprises a pair of patterned parts 51a and 51b and one bridge 51c. The patterned parts 51a and 51b are not circular, each being hexagonal. Each patterned part has six corners 52. The patterned parts 51a and 51b have a diagonal width W6, which is substantially equal to the width W1 of the electrode terminals 19a and 19b or the width W2 of the distal end portion 22a of the lead 22.

The bridge 51c straddles the patterned parts 51a and 51b, connecting the parts 51a and 51b together. The bridge 51c extends in a line connecting the centers of the patterned parts 51a and 51b. The width W7 of the bridge 51c is smaller than the width W6 of the patterned parts 51a and 51b. Preferably, the width W7 is half the width W6 or less. A solder resist covers the bridge 51c.

The patterned parts 51a and 51b have six corners 52 each. Nonetheless, the corners 52 have an obtuse angle, i.e. an angle greater than right angle. The corners 52 lie outside the electrode terminal 19a or 19b, or the distal end portion 22a of the lead 22. Therefore, molten solder hardly flows outwards from the terminals 19a or 19b or from the distal end portion 22a of the lead 22.

Further, the larger the angle of the corners 52, the shorter the distance the corners 52 may protrude from the terminals 19a or 19b or from the distal end portion 22a of the lead 22. In view of this, the patterned parts 51a and 51b may be replaced by octagonal ones. Alternatively, they may be replaced by patterned parts having more than eight corners. The more corners each patterned part has, the more circular it will be. The region in which the solder may flow can then be reduced.

The bridges 41c and 51c are not absolutely necessary in the second embodiment and the third embodiment, respectively. In other words, the patterned parts 41a and 41b need not be connected, and the patterned parts 51a and 51b need not be connected.

Figure 10:
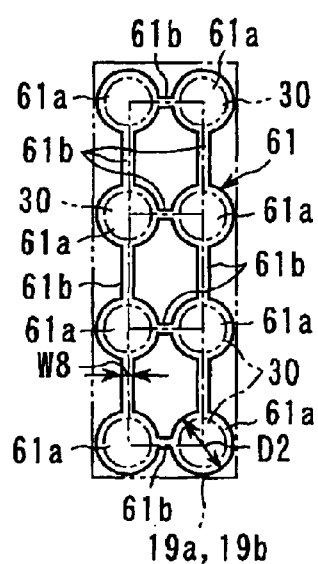
FIG. 10 is a plan view of a footprint according to the fourth embodiment of the present invention.

FIG. 10 shows a footprint 61 according to the fourth embodiment of the present invention. The footprint 61 has eight circular patterned parts 61a. The patterned parts 61 are arranged in four rows and two columns, beneath an electrode terminal 19a or 19b. Any two adjacent patterned parts 61a are electrically connected by a bridge 61b. The bridge 61b extends in a line connecting the centers of the patterned parts 61a. The bridge 61b has a width W8 is smaller than the diameter D2 of the patterned parts 61a. Preferably, the width W8 is half the diameter D2 or less. Resist solder covers the bridge 61b.

Figure 11:
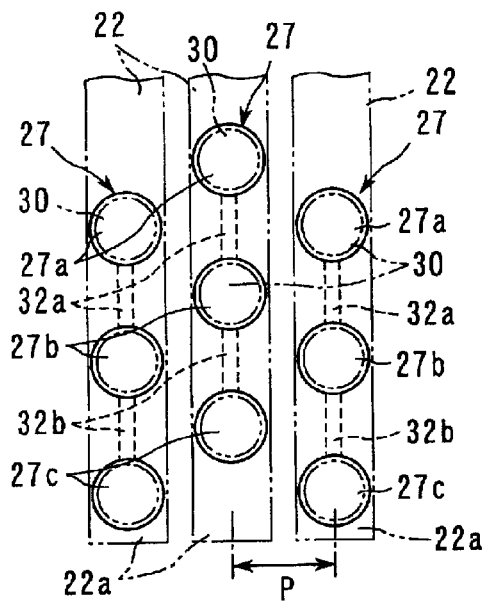
FIG. 11 is a plan view showing the positional relation that the leads of a QFP have with the patterned parts of footprints, in the fifth embodiment of the present invention.

FIG. 11 illustrates the fifth embodiment of the invention. More precisely, the FIG. 11 illustrates the positional relation that the leads 22 of a QFP have with the patterned parts of footprints 27. The footprints 27 are identical, in basic structure, to those used in the first embodiment. Each footprint 27 comprises three patterned parts 27a, 27b and 27c and two bridges 32a and 32b.

As FIG. 11 shows, any two adjacent footprints 27 are arranged such that the patterned parts 27a, 27b and 27c of one footprint 27 stagger with respect to those of the other foot print 27, in the lengthwise direction of the distal end portion 22a of the lead 22. This specific arrangement of the footprints 27 results in the following advantage.

Even if the molten solder on each patterned part of any footprint 27 flows a little from the distal end portion 22a of the lead 22, the footprint 27 will not be short-circuited to the adjacent footprints. The footprints 27 can therefore be arranged, side by side, at a short pitch P. If so arranged, the footprints 27 can solder a QFP having many leads 22 that are arranged at short intervals.

Figure 12:
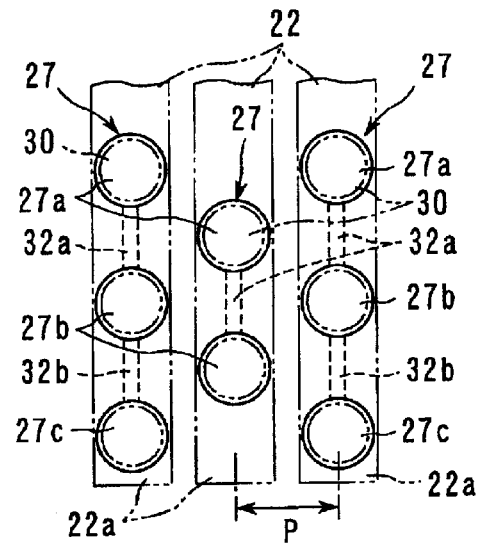
FIG. 12 is a plan view depicting the positional relation that the leads of a QFP have with the patterned parts of footprints, in the sixth embodiment of this invention.

FIG. 12 shows the sixth embodiment of the invention. The sixth embodiment is a modification of the fifth embodiment.

The sixth embodiment uses is a plan view depicting the positional relation that the leads of a QFP have with the patterned parts of footprints, in the sixth embodiment of this invention;

The sixth embodiment uses two groups of footprints 27 to solder the QFP 15 to the substrate 25. Each footprint 27 of the first group comprises three patterned parts 27a, 27b and 27c and two bridges 32a and 32b. Each footprint 27 of the second group comprises two patterned parts 27a and 27b and one bridge 32a. The footprints 27 of the first groups and the footprints 27 of the second group are alternately arranged in the direction the leads 22 of the QFP 15. Further, the patterned parts 27a, 27b and 27c of any footprint 27 of the first group stagger with respect to the patterned parts 27a and 27b of the adjacent footprint of the second group, in the lengthwise direction of the distal end portion 22a of the lead 22.

Figure 13:
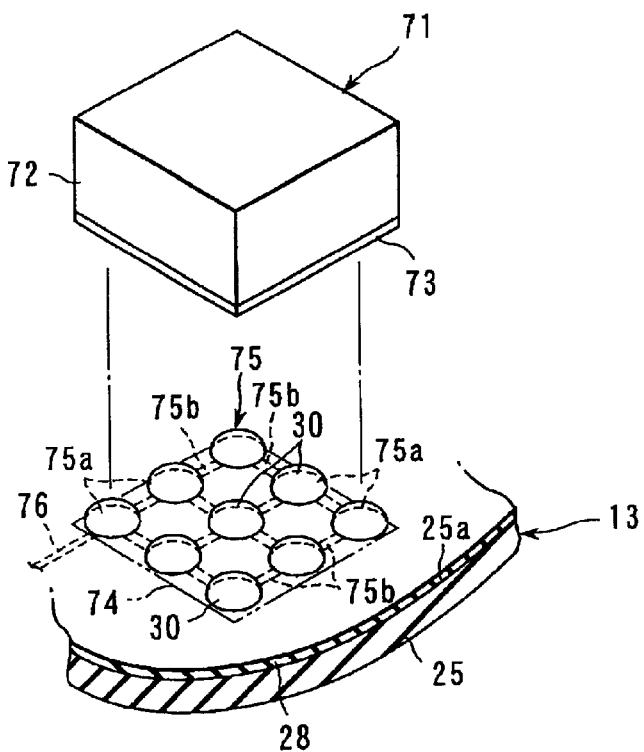
FIG. 13 is an exploded view illustrating the positional relation that an FET (Field-Effect Transistor) has with a printed circuit board in the seventh embodiment of the invention, said board having footprints each of which is covered with a solder layer.

FIG. 13 shows the seventh embodiment of the present invention.

The seventh embodiment has a printed circuit board 13 and an FET (Field Effect Transistor) 71 mounted on the board 13. The printed circuit board 13 is similar, in basic structure, to the printed circuit board of the first embodiment described above.

As FIG. 13 shows, the FET 71 is a rectangular parallelepiped that has a size of, for example, 10×10×10 mm. The FET 71 comprises a body 72 and a ground terminal 73. The ground terminal 73 is provided on the bottom of the body 72 and is large, covering the bottom entirely. The body 72 radiates heat while the FET 71 is operating. The ground terminal 73 receives the heat and is heated.

The printed circuit board 13 comprises a substrate 25. The substrate 25 has a square mounting region 74 on its upper surface 25a. A footprint 75 is provided in the mounting region 74, electrically connecting the FET 71 to the substrate 25. The footprint 75 comprises patterned parts 75a and brides 75b. The patterned parts 75a are arranged in rows and column, forming a matrix, each spaced apart from another in the mounting region 74. Any two adjacent patterned parts 75a are electrically connected by one bridge 75b. The bridges 75b are covered with solder resist 28. One of the patterned parts 75b is electrically connected to a conductor 76 provided on the substrate 25.

The patterned parts 75a have no corners each. Preferably, they are either circular or elliptical. Each patterned part 75a is covered with a solder layer 30. The solder layer 30 has been formed by print coating the pattered part 75a with solder paste, in the same method as in the first embodiment.

The FET 71 is mounted in the mounting region 74 by means of a parts mounter. The ground terminal 73 of the FET 71 is thereby put on the footprint 75 that has the solder layers 30. The solder layers 30 melt when the printed circuit board 13 is heated in a reflow furnace. The molten solder spreads over the circular patterned parts 75a, filling the gap between each patterned part 75a and the ground terminal 73. The solder solidifies as the printed circuit board 13 is cooled, connecting the ground terminal 73 to the footprint 75 electrically and mechanically.

As specified above, the footprint 75 comprises a plurality of patterned parts 75a that are arranged in rows and columns. Obviously, the footprint 75 has a smaller area than a single-layer footprint that has the same size as the ground terminal 73 of the FET 71. Hence, the amount of molten solder that spreads over the patterned parts 75a is smaller than it may spread over such a single-layer footprint, regardless of the size of the ground terminal 73.

None of the patterned parts 75a has corners protruding outwards from the ground terminal 73. This prevents the molten solder from flowing from the ground terminal 73. The molten solder may flow, but very little.

As indicated above, the footprint 75 has a smaller area than a single-layer footprint that has the same size as the ground terminal 73 of the FET 71. Consequently, the footprint 75 may fail to conduct heat efficiently from the body 72 of the FET 71 to the printed circuit board 13.

The inventors hereof conducted an experiment, in order to determine how the area of the footprint 75 influences the efficiency of heat conduction from the body 72 of the FET 71 to the printed circuit board 13. The results of the experiment showed that the footprint 75 efficiently conducted heat from the body 72 to the board 13 when the area of the footprint 75 ranged from ⅓ to ¾ of the area of the mounting region 74. The results also revealed that that the footprint 75 soldered the ground terminal 73 to the substrate 25, sufficiently firmly and strongly. Therefore, the footprint 75, though comprising a plurality of patterned parts and having a relatively small area, can secure a heat-radiating, surface mount device to a printed circuit board. Moreover, the footprint 75 can prevents the device from rotating from the desired position due to the flowing of molten solder.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed circuit board to which a surface mount device having a plurality of leads arranged at intervals is to be soldered, said printed circuit board comprising:

a substrate having a mounting surface on which the surface mount device is to be mounted, the leads of the surface mount device having a rectangular face opposed to the mounting surface; and a plurality of footprints arranged, side by side, on the mounting surface of the substrate and positioned to align with the leads, respectively, each of said footprints including a plurality of patterned parts each covered by a solder layer and bridges electrically connecting the patterned parts as well as being covered by a solder resist, the patterned parts having a width substantially equal to a width of the rectangular face of the leads, and said patterned parts being arranged in a column, spaced apart in a lengthwise direction of the lead and so shaped to limit a region in which molten solder flows when the solder layer is melted.

2. A printed circuit board according to claim 1, wherein the patterned parts of each footprint stagger with respect to those of any adjacent footprint, in the lengthwise direction of the lead.

3. A printed circuit board according to claim 1, wherein one patterned part is electrically connected to a patterned conductor formed on the substrate.

4. A printed circuit board to which a surface mount device having at least one terminal is to be soldered, said printed circuit board comprising:

a substrate having a mounting surface on which the surface mount device is to be mounted, the terminal of the surface mount device having a rectangular face opposed to the mounting surface; and at least one footprint arranged on the mounting surface and positioned to align with the terminal of the surface mount device, said one footprint including a plurality of patterned parts each covered by a solder layer and bridges which electrically connect the patterned parts as well as being covered by a solder resist, the bridges each having a width smaller than a width of the rectangular face, the patterned parts having a width substantially equal to a width of the rectangular face of the terminal, and each of said patterned parts being so shaped to limit a region in which molten solder flows when the solder layer is melted.

5. A printed circuit board according to claim 4, wherein the substrate has a conductor, and one of the patterned parts is electrically connected to the conductor.

* * * * *